(12) United States Patent
Zhou et al.

(10) Patent No.: US 7,042,331 B2
(45) Date of Patent: May 9, 2006

(54) FABRICATION OF THICK FILM ELECTRICAL COMPONENTS

(75) Inventors: Jiming Zhou, Kokomo, IN (US); Dwadasi H. Sarma, Kokomo, IN (US); Carl W. Berlin, West Lafayette, IN (US); John D Myers, Kokomo, IN (US); M. Ray Fairchild, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 150 days.

(21) Appl. No.: 10/639,794

(22) Filed: Aug. 12, 2003

(65) Prior Publication Data
US 2005/0035845 A1  Feb. 17, 2005

(51) Int. Cl.
*H01C 1/14* (2006.01)
(52) U.S. Cl. ...................................... 338/328; 338/309
(58) Field of Classification Search ................ 338/51, 338/52, 239, 252, 254, 260, 307, 309, 320, 338/308, 306, 332, 314
See application file for complete search history.

(56) References Cited

U.S. PATENT DOCUMENTS

| | | | |
|---|---|---|---|
| 3,370,262 A * | 2/1968 | Marty et al. ................. 338/309 |
| 4,613,844 A * | 9/1986 | Kent et al. ................... 338/314 |
| 4,766,412 A * | 8/1988 | Takakura et al. ........... 338/334 |
| 4,901,052 A | 2/1990 | Chapel, Jr. et al. | |
| 5,256,836 A | 10/1993 | Ezaki | |
| 5,548,268 A | 8/1996 | Collins | |
| 5,683,606 A | 11/1997 | Ushikoshi et al. | |
| 5,990,780 A * | 11/1999 | Caddock, Jr. ............... 338/309 |
| 6,136,512 A | 10/2000 | Doeling | |
| 6,229,098 B1 * | 5/2001 | Dunn et al. | |
| 6,429,533 B1 * | 8/2002 | Li et al. .................... 338/22 R |
| 6,507,993 B1 * | 1/2003 | Dunn ......................... 338/309 |

OTHER PUBLICATIONS

Copy of PCT search report dated Aug. 3, 2005.

* cited by examiner

*Primary Examiner*—Tu Hoang
(74) *Attorney, Agent, or Firm*—Scott A. McBain

(57) ABSTRACT

A thick-film resistor component may include a thick film component formed between a thick-film resistor and an electrically conductive sheet, wherein a portion of the sheet is selectively removed to form resistor contacts while exposing a portion of the thick-film component. Electrical terminals to a thick-film resistor may be sized to reduce stress and/or be selectively positioned relative to the resistor to define a desired resistor value. A thick-film resistor may include one or more resistor segments configured to be selectively open-circuited to incrementally adjust the value of the resistor.

15 Claims, 4 Drawing Sheets

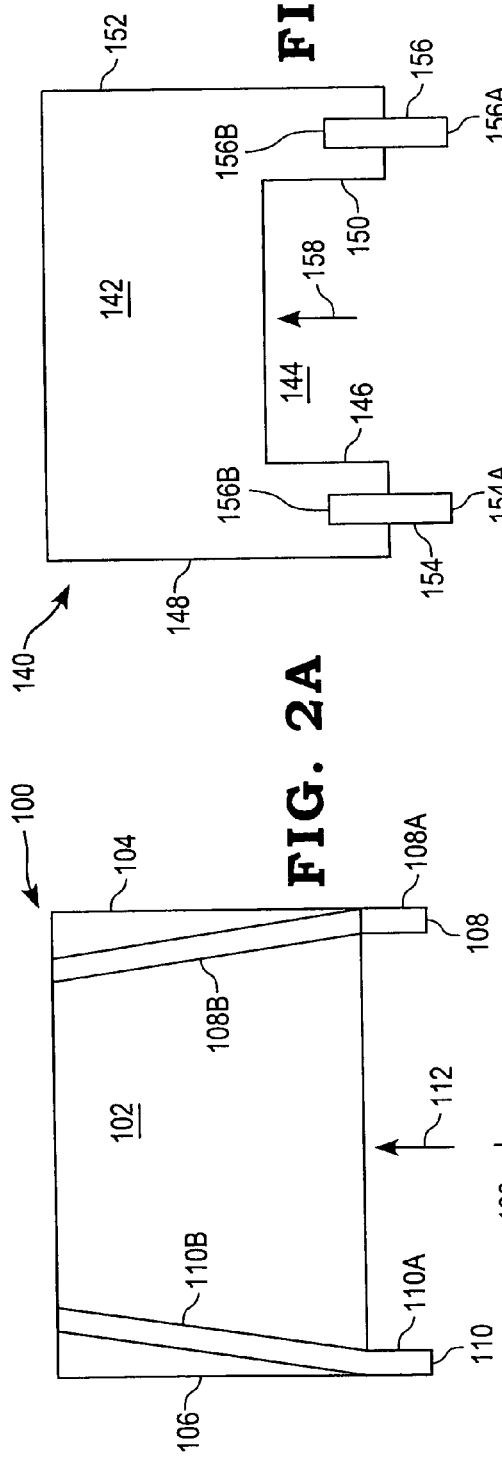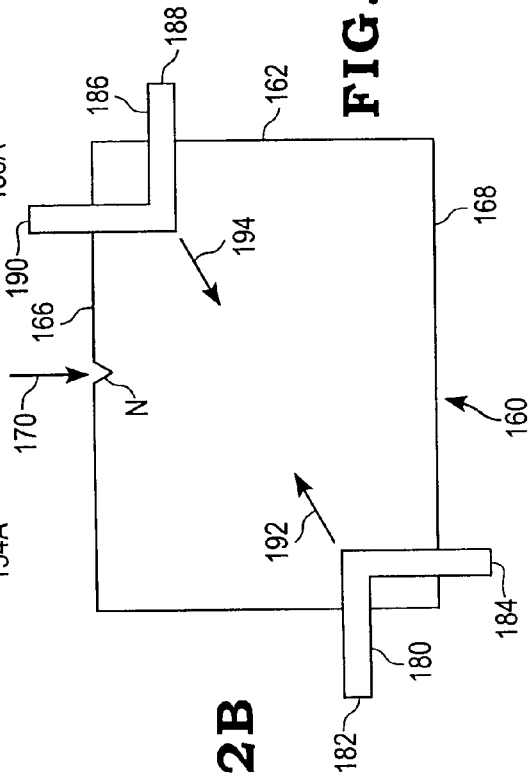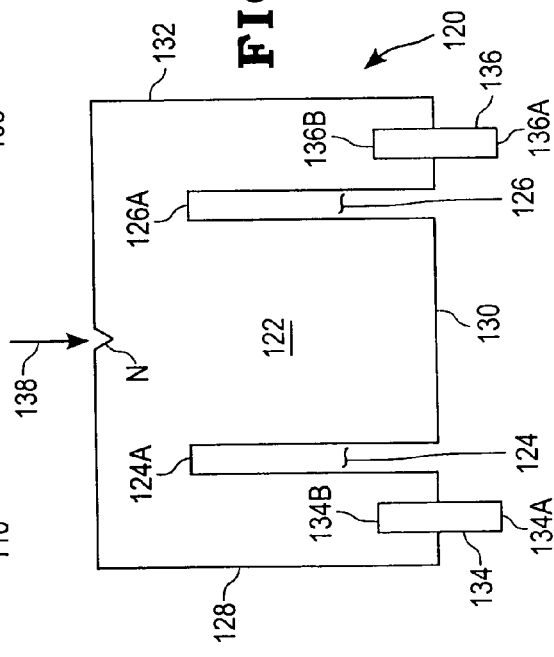

FABRICATION OF THICK FILM ELECTRICAL COMPONENTS

TECHNICAL FIELD

The present invention relates generally to materials and techniques for fabricating thick film resistor elements, and more specifically to such materials and techniques for improving thick film resistor fabrication, trimmability, mechanical stability, thermal matching between resistor and terminal elements and other thick film resistor properties and features.

BACKGROUND OF THE INVENTION

It is generally desirable to fabricate thick-film resistor components on flexible and non-flexible substrates for the purpose of providing discrete resistor components. It is further desirable to improve the fabrication, trimmability, mechanical stability, thermal matching between resistor and terminal elements, and other thick film resistor properties and features.

SUMMARY OF THE INVENTION

The present invention comprises one or more of the following features or combinations thereof. A thick-film resistor component may comprise a first electrically conductive sheet having first and second opposite surfaces, a first thick-film component having first and second opposite surfaces, the first surface of the first thick-film component adhered to the first surface of the first sheet, and a first thick-film resistor having first and second surfaces, the first surface of the first resistor adhered to the second surface of the first thick-film component and to the first surface of the first sheet adjacent to the first thick-film component. A first electrically insulating layer may be formed over the combination of the first thick-film component and the first resistors and the first electrically conductive sheet. A portion of the first sheet may be selectively removed adjacent to the first thick-film component such that a remaining first portion of the first sheet defines a first electrical contact to the first resistor, a remaining second portion of the first sheet defines a second electrical contact to the first resistor, and the first surface of the first thick-film component is at least partially exposed therebetween, the first resistor forming the thick-film resistor component between the first and second contacts.

The portion of the first electrically conductive sheet may be selectively removed via an etchant, and the first thick-film component may be formed of a material that is unreactive with the etchant and the first thick-film resistor may be formed of a material that is reactive with the etchant, the first thick-film component shielding the first thick-film resistor from the etchant.

The first thick-film component may be formed of an electrically insulating material such as, for example, $SiO_2$. Alternatively, the first thick-film component may be a second thick-film resistor, wherein the second surface of the second thick-film resistor is electrically bonded to the first surface of the first resistor, and wherein the first and second contacts are each in electrical contact with both of the first and second thick-film resistors, the first and second thick-film resistors defining a parallel-connected thick-film resistor component.

The material forming the first thick-film resistor may have a higher metal content than the material forming the second thick-film resistor.

The first thick-film resistor may be a low-valued sense resistor and the second thick-film resistor may have a resistor value substantially higher than the low-valued sense resistor.

The first thick-film resistor may be formed of a combination of a metallic compound and an electrically insulating material and the second thick-film resistor may be formed of a polymer-based resistor film.

The resistor component may further include an electrically insulating film formed over the second surface of the first thick-film resistor and in contact with the first surface of the first sheet about a periphery of the combination of the first thick-film component and first thick-film resistor. The resistor component may further include a second electrically conductive sheet formed over the second electrically insulating layer.

The resistor component may further include a number of thermally conductive members extending through the second electrically insulating layer in contact with a remaining third portion of the first electrically conductive sheet in contact with the first thick-film component and positioned between the first and second electrical contacts. A thermally conductive sheet may further be formed on the second electrically insulating layer in electrical contact with the number of thermally conductive members and electrically isolated from the second electrically conductive layer, the third portion of the first electrically conductive sheet, the number of thermally conductive members and the thermally conductive sheet forming a heat sink for the thick-film resistor component.

A method for fabricating a thick-film resistor component may comprise the steps of patterning a thick-film resistive material on a substrate, forming a first conductor having a terminal portion extending into the resistive material along a first edge thereof, forming a second conductor having a terminal portion extending into the resistive material along a second edge thereof, and positioning the terminal portions of the first and second conductors relative to the resistive material to define a desired resistance value of the thick-film resistor component therebetween.

The step of forming a first conductor may include forming the first conductor with the terminal portion thereof extending into the resistive material along the first edge thereof and terminating at a second edge thereof, and the step of forming a second conductor may include forming the second conductor with the terminal portion thereof extending into the resistive material along the third edge thereof and terminating at a fourth edge thereof. The first edge of the resistive material may be the same as the second edge thereof, and the third edge of the resistive material may be the same as the fourth edge thereof.

The step of forming a first conductor may include forming the first conductor with the terminal portion thereof extending into the resistive material along the first edge thereof and exiting the resistive material along a second edge thereof. The step of forming a second conductor may include forming the second conductor with the terminal portion thereof extending into the resistive material along the third edge thereof and exiting the resistive material along a fourth edge thereof. The first edge of the resistive material may be the same as the second edge thereof, and the third edge of the resistive material may be the same as the fourth edge thereof.

The first edge of the resistive material may be opposite the second edge, and the third edge of the resistive material may be opposite the fourth edge, the first and second edges each adjacent to the third and fourth edges.

The thick-film resistor material may be formed of a resistive ceramic material, and the method may further include the step of sizing the terminal portions of the first and second conductors to minimize stress resulting from a mismatch between a coefficient of thermal expansion of the thick-film resistor material and a coefficient of thermal expansion of the terminal portions of the first and second conductors.

A thick-film resistor component may comprise a thick-film resistor material formed on a substrate in a serpentine configuration with a plurality of long legs having long edges positioned adjacent to each other and a plurality of short legs connecting alternate ends of the plurality of long legs together such that resulting adjacent pairs of the plurality of long legs each have a closed end and an open end. A first resistor segment may be formed on the substrate from the thick-film resistor material and connect together an adjacent pair of the plurality of long legs at a corresponding open end thereof. The first resistor segment may be configured to be selectively open-circuited to incrementally adjust a resistance value of the thick-film resistor component. The resistor component may further include a plurality of the first resistor segments each formed on the substrate from the thick-film resistor material and connecting together different ones of the adjacent pairs of the plurality of long legs at corresponding open ends thereof, and each of the plurality of the first resistor segments may be configured to be selectively open-circuited to incrementally adjust the resistance value of the thick-film resistor component.

The resistor component may further include a second resistor segment formed on the substrate from the thick-film resistor material and connecting together an adjacent pair of the plurality of long legs along the long edges and between the open and closed end thereof. The second resistor segment may be configured to be selectively open-circuited to incrementally adjust the resistance value of the thick-film resistor component. The resistor component may further include a plurality of the second resistor segments each formed on the substrate from the thick-film resistor material and connecting together selected ones of adjacent pairs of the plurality of long legs along the long edges and between the open and closed ends thereof, and each of the plurality of the second resistor segments configured to be selectively open-circuited to incrementally adjust the resistance value of the thick-film resistor component.

The resistor component may further include a first conductor having a terminal portion extending into an open end of a first one of the plurality of long legs, and a second conductor having a terminal portion extending into an open end of another one of the plurality of long legs, the thick-film resistor component defining the resistance value between the terminal portions of the first and second conductors.

A thick-film resistor component may comprise a thick-film resistor material formed on a substrate in a serpentine configuration with a plurality of long legs having long edges positioned adjacent to each other and a plurality of short legs connecting alternate ends of the plurality of long legs together such that resulting adjacent pairs of the plurality of long legs each have a closed end and an open end. A first resistor segment may be formed on the substrate from the thick-film resistor material and connect together an adjacent pair of the plurality of long legs along their long edges between a corresponding open and closed end thereof. The first resistor segment may be configured to be selectively open-circuited to incrementally adjust a resistance value of the thick-film resistor component. The resistor component may further include a plurality of the first resistor segments each formed on the substrate from the thick-film resistor material and connecting together selected ones of the adjacent pairs of the plurality of long legs along their long edges between open and closed ends thereof, and each of the plurality of the first resistor segments configured to be selectively open-circuited to incrementally adjust the resistance value of the thick-film resistor component.

The resistor component may further include a second resistor segment formed on the substrate from the thick-film resistor material and connecting together an adjacent pair of the plurality of long legs at an open end thereof. The second resistor segment may be configured to be selectively open-circuited to incrementally adjust the resistance value of the thick-film resistor component. The resistor component may further include a plurality of the second resistor segments each formed on the substrate from the thick-film resistor material and connecting together different ones of adjacent pairs of the plurality of long legs at corresponding open ends thereof, and each of the plurality of the second resistor segments configured to be selectively open-circuited to incrementally adjust the resistance value of the thick-film resistor component.

The resistor component may further include a first conductor having a terminal portion extending into an open end of a first one of the plurality of long legs, and a second conductor having a terminal portion extending into an open end of a last one of the plurality of long legs, the thick-film resistor component defining the resistance value between the terminal portions of the first and second conductors.

These and other features of the present invention will become more apparent from the following description of the illustrative embodiments.

BRIEF DESCRIPTION OF THE DRAWINGS

FIGS. 2A–2D are top plan views of a number of different thick film resistor configurations illustrating various embodiments of terminal connections thereto.

DESCRIPTION OF THE ILLUSTRATIVE EMBODIMENTS

Figure 1A:
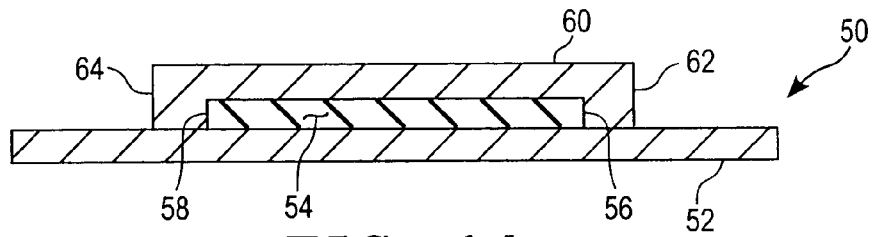
FIGS. 1A–1F are cross-sectional views illustrating various processing stages of one embodiment of a low-valued, thick-film sense resistor formed on a multi-layer circuit board.

Referring now to FIGS. 1A–1F, cross-sectional views of various processing stages of one embodiment of a low-valued, thick-film resistor component 50 formed on a multi-layer circuit board are illustrated. In the illustrated process, a thick-film material is deposited, printed, grown or otherwise formed on an electrically conductive sheet or strip 52 in a known manner such that a thick-film component 54 results having a first surface adhered to the electrically conductive sheet 52 as shown in FIG. 1A. Illustratively, the electrically conductive sheet 52 may formed of copper (Cu), a copper compound, or other known electrically conductive material or materials. In any case, the resultant thick-film resistor 14 defines a first end 56 and an opposite second end 58. A thick-film resistive material is deposited, printed or otherwise formed over the exposed surface of the thick-film material forming the thick-film component 54, and in contact with the top surface of the electrically conductive sheet 52 about the periphery of the thick-film component 54 to form a thick-film resistor 60. A first end 62 of the resistor 60 is in contact with, and adhered to, the sheet 52 adjacent to the first end 56 of the thick-film component 54, and a second opposite end 64 of the resistor 60 is in contact with, and adhered to, the sheet 52 adjacent to the second end 58 of the thick-film component 54. The thick-film resistor 60 is further adhered to all exposed surfaces of the thick-film component 54.

Figure 1B:
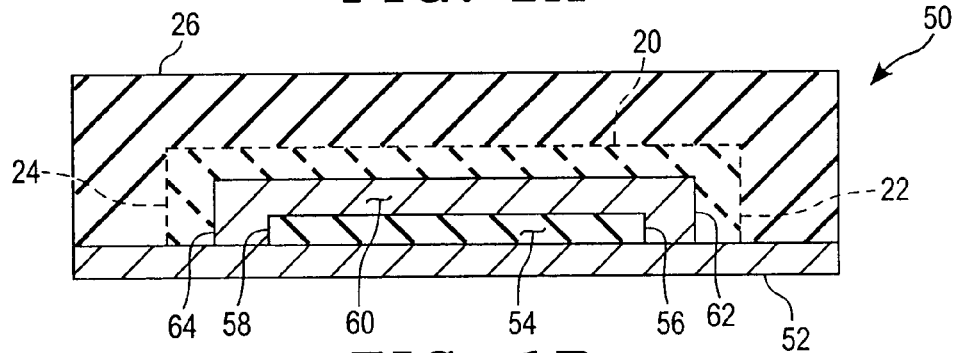

As shown in FIG. 1B, an electrically insulating film 20 may optionally be deposited, printed or otherwise formed over the exposed surface of the thick-film resistor 60 and in contact with the top surface of the electrically conductive sheet 52 about the periphery of the combination thick-film component 54 and thick-film resistor 60. If included, a first end 22 of the film 20 is in contact with, and adhered to, the sheet 52 adjacent to the first end 66 of the thick-film resistor 60, a second opposite end 24 of the film 20 is in contact with, and adhered to, the sheet 52 adjacent to the second end 64 of the thick-film resistor 60, and the film 20 is further adhered to all exposed surfaces of the thick-film resistor 60.

A first electrically insulating layer 26 is formed over the combination of the thick-film resistor 60, thick-film component 54, electrically conductive sheet 52 and, if included, electrically insulating film 20, as illustrated in FIG. 1B. Layer 26 is adhered to the exposed surface of the electrically conductive sheet 52 as well as to the exposed surface area of the thick-film resistor 54 (or to film 20, in embodiments including film 20). In one embodiment, the first electrically insulating layer 26 is a known formable flexible circuit board material, an example of which may be, but should not be limited to, FR4. Alternatively, layer 26 may be a known formable material that cures to form a rigid circuit board material, an example of which may be, but should not be limited to, an electrically non-conductive, rigidly formable epoxy.

Figure 1C:
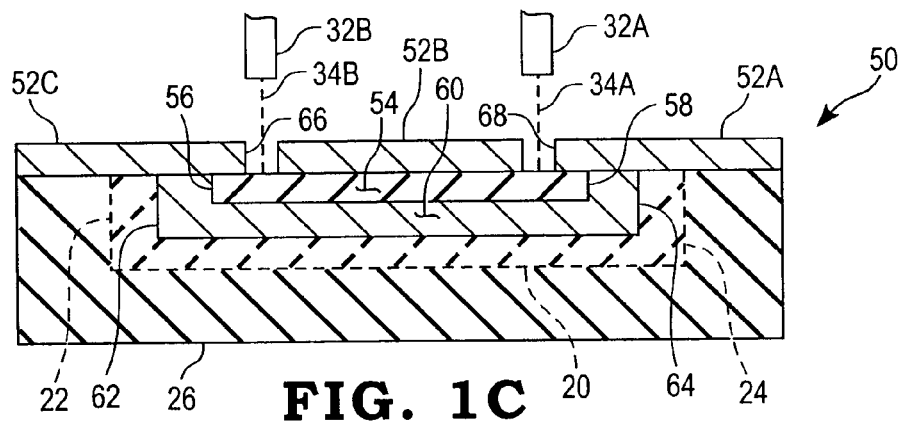

As illustrated in FIG. 1C, a portion of the electrically conductive sheet 52 is selectively removed adjacent to the thick-film component 54 such that a portion of the first surface of the thick-film component 54 adjacent to walls 66 and 68 of the remaining portions 52C and 52A respectively of the sheet 52 is exposed with a section 52B of the sheet 52 remaining therebetween. Selective removal of the portion of the sheet 52 adjacent to the thick-film component 54 as just described may be accomplished in accordance with any of a number of known techniques, examples of which may include, but should not limited to, etching via a known chemical etchant, milling or the like. In any case, the portion 52A of the remaining sheet 52 adjacent to wall 68 remains in contact with the thick-film component 54 adjacent end 58 and with the thick-film resistor 60 adjacent end 64 to form a first electrical contact thereto, and the portion 52C of the remaining sheet 52 adjacent to wall 66 remains in contact with the thick-film component 54 adjacent to end 56 and with the thick-film resistor 60 adjacent end 62 to form a second electrical contact thereto, with the portion 52B of the sheet 52 adhered to the first surface of the thick-film component 54 and a portion of the first surface of the thick-film component 54 exposed between sheet portions 52A, 52B and 52C as illustrated. The value of the thick-film resistor is defined between the first and second electrical contacts.

In the illustrated embodiment, the thick-film resistor 60 is a low-valued resistor suitable for use as a sense resistor, and may typically have a resistance value of less than one ohm, although higher resistor values are contemplated. In this embodiment, the resistor material used to fabricate resistor 60 may have a high metallic content. In one specific embodiment, for example, resistor 60 is formed of between approximately 100–85% Silver Palladium (AgPd) and approximately 0–15% $SiO_2$ to form a resistor having a resistance value of a few ohms or less. In embodiments wherein the resistor material used to fabricate the thick-film resistor 60 has a sufficiently high metallic content, and wherein a chemical etchant is used to selectively remove a portion of the electrically conductive sheet 52 adjacent to the thick-film component 54 as just described, such a resistor may be reactive with this chemical etchant and therefore susceptible to etching thereby if the thick-film resistor 60 was otherwise formed directly on the surface of the electrically conductive sheet 52. In such embodiments, the thick-film component 54 is formed between the sheet 52 and thick-film resistor 60, as illustrated in FIGS. 1A–1F, wherein the material composition of the thick-film component is selected such that it is non-reactive with, and therefore will not be etched away by, the chemical etchant used to selectively remove portions of the electrically conductive sheet 52, and such that it will not materially alter the resistance value of the thick-film resistor 60. In embodiments of the thick-film resistor component 50 wherein it is desirable to selectively adjust the value of the thick-film resistor 60, such as via resistor value adjusting radiation; e.g., a laser, the material composition of the thick-film component 54 may further be selected to allow passage therethrough of the resistor value adjusting radiation. The thick-film component 54 formed between the electrically conductive sheet 52 and the low-valued, thick-film resistor 60 as just described thus acts as a shield to isolate and protect the thick-film resistor 60 from the chemical etchant used to selectively remove portions of the electrically conductive sheet 52.

In one embodiment, the material forming the thick-film component 54 may be an electrically insulating material, such as $SiO_2$, $Si_3N_4$, polyimide or other electrically insulating material that may be deposited, printed, grown or otherwise formed on the sheet 52 in a known manner, and that is non-reactive with the chemical etchant used to selectively remove portions of the electrically conductive sheet 52. In this embodiment, the electrically insulating material forming the thick-film component 54 will generally not affect the resistance value of the thick-film resistor 60, and any such electrically insulating material may be selectively removed via resistor value adjusting radiation in the adjustment of the thick-film resistor 60 without adversely affecting the structure and operation of the thick-film resistor component 50.

In an alternate embodiment, the thick-film material forming the thick-film component 54 may be another resistive material such as a polymer-based resistive material or other known resistive material having a sufficiently low metallic contact such that it is non-reactive with the chemical etchant used to selectively remove portions of the electrically conductive sheet 52. In this case, the thick-film component 54 will thus be a second thick-film resistor having one end 64 in electrical contact with the first electrical contact formed by remaining portion 52A of the electrically conductive sheet 52, an opposite end 62 in electrical contact with the second electrical contact formed by remaining portion 52C of the electrically conductive sheet, and a top surface adhered and electrically bonded to the bottom surface of the thick-film resistor 60, such that the resulting thick-film resistor component 50 is the parallel combination of resistors 54 and 60. To avoid materially affecting the resistance value of the thick-film resistor 60 in this embodiment, it is desirable to select or configure the resistive material used to form the second thick-film resistor 54 such that the resistance value of the second thick-film resistor 54 is substantially greater than the resistance value of the first thick-film resistor 60. In this embodiment, resistive material from the second thick-film resistor 54 may be selectively removed via resistor value adjusting radiation in the adjustment of the thick-film resistor 60 without adversely affecting the structure and operation of the thick-film resistor component 50.

In either of the foregoing illustrative examples, the value of the thick-film resistor 60 may be adjusted by selectively removing one or more portions of the resistor material used to form resistor 60 in a known manner. As further illustrated in FIG. 1C, for example, a pair of radiation-producing apparatus 32A and 32B; e.g., lasers, may be configured to controllably direct resistor value adjusting radiation 34A and/or 34B through thick-film component 54 to one or more selected portions of the thick-film resistor 60 to selectively remove resistor material therefrom in a known manner and thereby controllably adjust the value of the resistor 60.

Figure 1D:
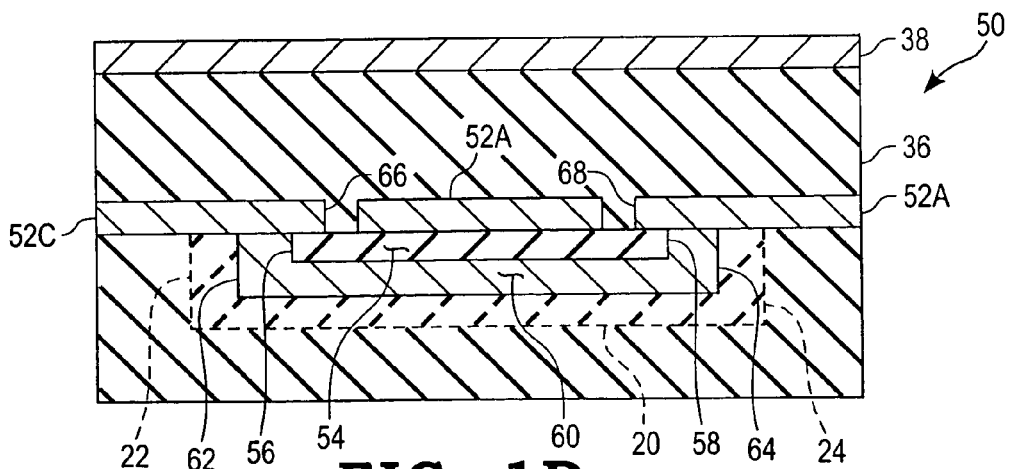

A second electrically insulating layer 36 may be formed over the exposed first side of the thick-film component 54 and the exposed underside of the electrically conductive sheet portions 52A, 52B and 52C as illustrated in FIG. 1D, and a second electrically conductive sheet 38 may be formed over the second electrically insulating layer 36. Other circuit-carrying and/or electrically insulating layers may further be added to the thick-film resistor component 50 illustrated in FIGS. 1A–1D to complete a circuit or subcircuit as is known in the art. In any case, layer 36 is adhered to the exposed first surface of the thick-film component 50 and to the exposed underside of the electrically conductive sheet 52. In one embodiment, the second electrically insulating layer 36 is identical to the first electrically insulating layer 26, and is a known formable flexible circuit board material, an example of which may be, but should not be limited to, FR4. Alternatively, layer 36 may be a known formable material that cures to form a rigid circuit board material, an example of which may be, but should not be limited to, an electrically non-conductive, rigidly formable epoxy.

In the embodiment illustrated in FIGS. 1B–1F, the material composition of the electrically insulating film 20, if included, may be selected to accomplish any one or combination of a number of functions. For example, it may be desirable, depending upon the material compositions of the thick-film resistor 60, thick film component 50 and/or first electrically insulating layer 26, to select the material composition of the film 20 such that it promotes adhesion between resistor 14 and layer 26. Such a film 20 may be formed of a polymer and ceramic bead combination developed by E.I. DuPont De Nemurs & Co., and has been found to provide such adhesion promoting properties. Those skilled in the art will recognize other adhesion promoting compositions suitable for use in forming film 20, and that such other compositions will generally be determined, at least in part, by the material compositions of the thick-film resistor 60, thick-film component 50, and/or the first electrically insulating material 26, and possibly by the fabrication environment and/or operating environment of the resulting product. Any such other adhesion promoting compositions of the electrically insulating film 20 are intended to fall within the scope of the claims appended hereto.

It may further be desirable, again depending upon the material compositions of the thick-film resistor 60, thick-film component 50 and/or the first electrically insulating layer 26, to select the material composition of the film 20 such that it supports, and provides stress relief to, the resistor 60. For example, in embodiments wherein the thick-film resistor 60, thick-film component 50 and first electrically insulating layer 26 are flexible components, it may be desirable to formulate film 20 such that it supports, and provides stress relief to, the resistor 60. Again, one formulation of film 20 that provides such support and stress relief is a polymer and ceramic bead combination developed by E.I. DuPont De Nemurs & Co. as described hereinabove. Those skilled in the art will recognize other compositions suitable for use in forming film 20 that provides support to, and stress relief to, the thick-film resistor 60, and that such other compositions will generally be determined, at least in part, by the material compositions of the thick-film resistor 60, thick-film component 50 and/or the first electrically insulating material 26, and possibly by the fabrication environment and/or operating environment of the resulting product. Any such other compositions of the electrically insulating film 20 are intended to fall within the scope of the claims appended hereto.

In embodiments wherein the value of the thick-film resistor 60 is adjusted or "trimmed" via resistor value adjusting radiation; e.g., a laser, it may further be desirable to select the material composition of the film 20 such that it diverts or absorbs any of the radiation that passes through the resistor 60 in the direction of the first electrically insulating layer 26, as well as any resulting heat generated thereby. Damage to the first electrically insulating layer 26 and any circuitry contained therein can thereby be avoided. For purposes of this description, the term "radiation blocking" will be used hereinafter to describe the property of the electrically insulating film 20 that allows it to divert or absorb radiation produced by radiation sources 32A and 32B and any heat generated thereby, and to accordingly inhibit passage of radiation and heat through the film 20 into the first electrically insulating layer. Again, one formulation of film 20 that provides such radiation blocking is a polymer and ceramic bead combination developed by E.I. DuPont De Nemurs & Co. as described hereinabove. Those skilled in the art will recognize other compositions suitable for use in forming film 20 that provides such a radiation blocking feature, and that such other compositions will generally be determined, at least in part, by the material compositions of the thick-film resistor 60, thick-film component 50 and/or the first electrically insulating material 26, as well as the strength and wavelength of the radiation 34A and 34B produced by the radiation sources 32A and 32B respectively. Any such other compositions of the electrically insulating film 20 are intended to fall within the scope of the claims appended hereto.

Figure 1E:
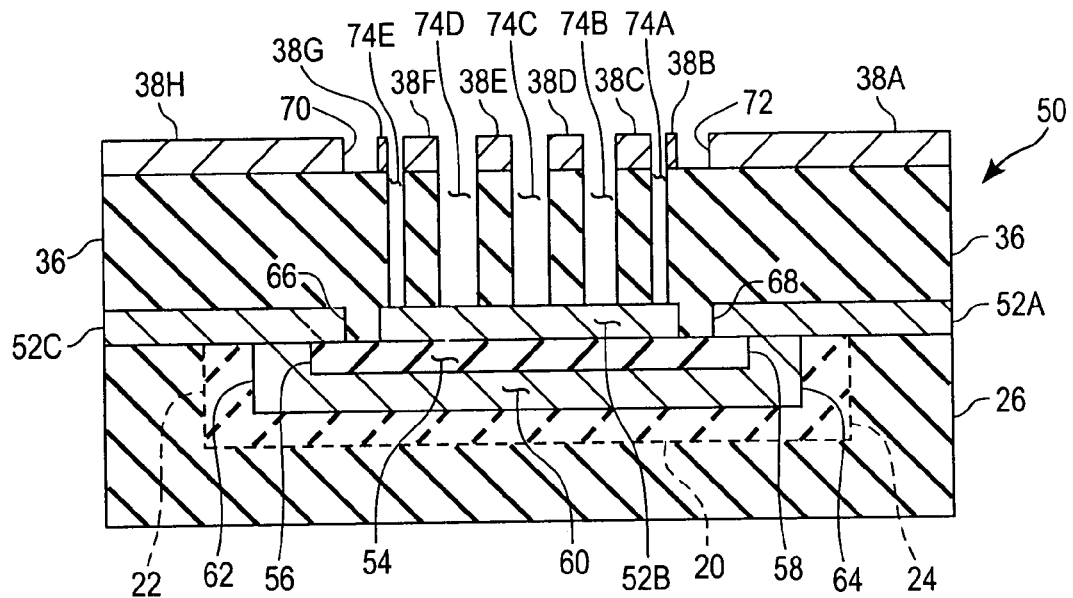
Figure 1F:
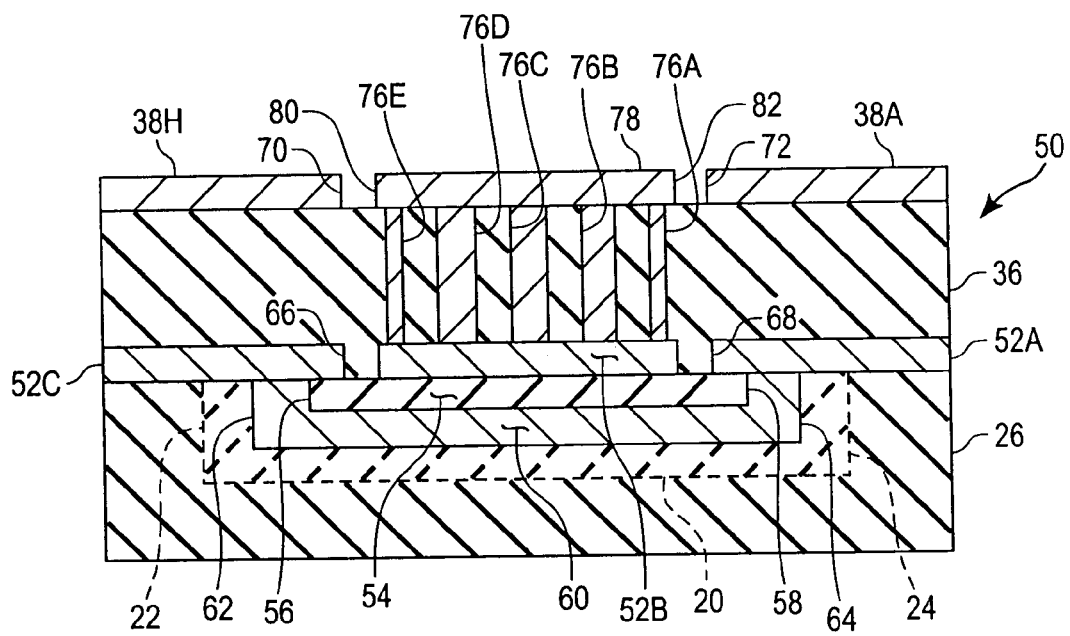

In some applications, resistor component 50 may be required to dissipate a substantial amount of power, thereby resulting in the generation of heat. It may accordingly be desirable to provide resistor component 50 with a heat sink structure to dissipate heat generated by the resistor component 50, and a process for fabricating one embodiment of such a heat sink structure is illustrated in FIGS. 1E–1F. Referring to FIG. 1E, a number of portions of the second electrically conductive sheet 38 and corresponding underlying portions of the second electrically insulating layer 36 are removed to form wells, bores or vias 74A–74E extending to the third remaining portion 52B of the first electrically conductive sheet 52B. Wells, bores or vias 74A–74E may be formed via conventional techniques including for example, but not limited to, chemical etching, micro-machining, etc. A number of walled portions of the second electrically insulating layer 36 are defined thereby; e.g., four such walled portions shown in FIG. 1E, which are capped by remaining portions 38C–38F of the second electrically conductive sheet 38. To isolate the heat sink structure from the remaining portions of the second electrically conductive sheet 38, portions of the second electrically conductive sheet 38 are removed adjacent to wells 74A and 74E respectively, resulting in a first portion 38A, terminating at wall 72, and a second portion 38H, terminating at wall 70, and two cap portions 38B and 38G adjacent to wells 74A and 74E respectively.

Referring to FIG. 1F, thermally conductive members are formed within each of the wells, bores or vias 74A–74E in thermal contact with the third portion of the first electrically conductive sheet 52B. The thermally conductive members may be formed via conventional techniques, and may be the same material used to form the electrically conductive sheets 52 and 38, although other known thermally conductive materials may alternatively be used to form the thermally conductive members. In any case, a thermally conductive sheet 78 is then formed over and in thermal contact with the thermally conductive members, wherein the thermally conductive sheet 78 terminates at walls 80 and 82 respectively, adjacent to but spaced apart from walls 70 and 72 of the second portion 38H and first portion 38A respectively of the second electrically conductive sheet 38. In the illustrated embodiment, the thermally conductive sheet 78 is formed of the same material used to form the second electrically conductive sheet 38, and the thermally conductive sheet 78 accordingly appears in FIG. 1F as a unitary structure. Alternatively, other known thermally conductive materials may be used to form the thermally conductive sheet 78, wherein such other thermally conductive materials may adhere to, or bond with, the portions 38B–38G of the second electrically conductive sheet 38, or alternatively still, the portions 38B–38G may be removed prior to forming the thermally conductive sheet 78. In any case, the thermally conductive sheet 78 is in thermal contact with the third portion 52B of the first electrically conductive sheet 52 via the thermally conductive members formed therebetween, to thereby provide a heat sink structure operable to draw heat away from the thick-film resistor component 50.

Referring now to FIGS. 2A–2D, top plan views are shown of a number of different thick film resistor configurations illustrating various embodiments of terminal connections thereto. In FIG. 2A, for example, one embodiment of a thick-film resistor 100 includes a resistor pattern 102 formed from a known resistor material on a substrate in a rectangular configuration using known techniques therefore. Resistor pattern 102 defines a first edge 104, a second edge 106 opposite and parallel to the first edge 104 and generally parallel edges extending therebetween. A first electrical conductor 108 has a first portion 108A extending to the resistor pattern 102 and a second terminal portion 108B extending into the resistor along one of the edges parallel to edge 104 and terminating at an opposite edge parallel to edge 104. Similarly, a second electrical conductor 110 has a first portion 110A extending to the resistor pattern 102 and a second terminal portion 110B extending into the resistor along one of the edges parallel to edge 106 and terminating at an opposite edge parallel to edge 106. Terminal portions 108B and 1101B extend into the same edge of the resistor pattern 102, and angle generally toward each other and away from their respective edges 104 and 106, and define the value of the resistor 100 therebetween. Alternatively, the terminal portions 108A and 108B may extend beyond opposite edge parallel to edges 104 and 106. In any case, the thick-film resistor 100 may be adjusted or "trimmed" in value via known techniques. An example of one such technique is via resistor value adjusting radiation; e.g., laser trimming, and radiation from a suitable resistor value adjusting radiation source (not shown) may be directed to the resistor pattern 102 in, for example, the direction and location indicated by arrow 112. By way of illustration only, example dimensions of the resistor 100 illustrated in FIG. 2A may be: resistor pattern 102=30×50 mils, terminals 108 and 110=5 mils wide, and spacing between the top portions of the terminals 108 and 110 and corresponding resistor pattern sides 104 and 106=7 mils. It will be understood, however, that such dimensions may differ depending upon the application, and any such alternate dimensions are intended to fall within the scope of the claims appended hereto.

Another example embodiment of a thick-film resistor 120 is illustrated in FIG. 2B, and includes a resistor pattern 122 formed from a known resistor material on a substrate in a generally rectangular configuration using known techniques therefore. Resistor pattern 122 defines a pair of parallel notches or channels 124 and 126 each extending into one edge 130 of the resistor pattern and terminating within the resistor pattern 122 at channel ends 124A and 126A respectively. Edge 130 extends away from channel 126 and beyond channel 124 to a first edge 128, and likewise extends away from channel 124 and beyond channel 126 to a second edge 132 opposite edge 126. A fourth edge, opposite edge 130, extends between edges 128 and 132 generally parallel with edge 130, and defines a v-shaped notch "N" positioned between channels 124 and 126. A first electrical conductor 134 has a first portion 134A extending to edge 130 between edge 128 and channel 124, and a second terminal portion 134B extending into the resistor pattern 122 in a direction generally parallel with edge 128. Similarly, a second electrical conductor 136 has a first portion 136A extending to edge 130 between edge 132 and channel 126, and a second terminal portion 136B extending into the resistor pattern 122 in a direction generally parallel with edge 132. Terminal portions 134B and 136B define a resistive path and a resistor value therebetween that is routed generally around the terminal ends 124A and 126A of channels 124 and 126 respectively. The thick-film resistor 120 may be adjusted or "trimmed" in value via known techniques. An example of one such technique is via resistor value adjusting radiation; e.g., laser trimming, and radiation from a suitable resistor value adjusting radiation source (not shown) may be directed to the resistor pattern 122, for example, into the v-shaped notch "N" in the direction indicated by arrow 138. By way of illustration only, example dimensions of the resistor 120 illustrated in FIG. 2B may be: resistor pattern 122=70×85 mils, channels 124 and 126=10.5×58 mils, notch N=10 mils wide at open end×5 mils deep and terminals 134 and 136=5 mils wide and 12 mils deep into the resistor pattern 122. It will be understood, however, that such dimensions may differ depending upon the application, and any such alternate dimensions are intended to fall within the scope of the claims appended hereto.

A further example embodiment of a thick-film resistor 140 is illustrated in FIG. 2C, and includes a resistor pattern 142 formed from a known resistor material on a substrate in a generally rectangular configuration using known techniques therefore. Resistor pattern 142 defines a channel or notched-out portion 144 extending into one edge of the resistor pattern 142 and terminating within the resistor pattern 142 at generally parallel channel ends 146 and 150 respectively. One edge 148 of the resistor pattern 142 is generally parallel with edges 146 and 160, and a second edge 152 opposite edge 148 is generally parallel with edges 146, 148 and 150. A fourth edge, opposite the terminal end of channel 144, extends between edges 148 and 152. A first electrical conductor 154 has a first portion 154A extending to the resistor pattern 142 between edges 146 and 148, and a second terminal portion 154B extending into the resistor pattern 142 in a direction generally parallel with edges 146 and 148. Similarly, a second electrical conductor 156 has a first portion 156A extending to the resistor pattern 142 between edges 150 and 152, and a second terminal portion 156B extending into the resistor pattern 142 in a direction generally parallel with edges 150 and 152. Terminal portions 154B and 156B define a resistive path and a resistor value therebetween that is routed generally around the channel 144. The thick-film resistor 140 may be adjusted or "trimmed" in value via known techniques. An example of one such technique is via resistor value adjusting radiation; e.g., laser trimming, and radiation from a suitable resistor value adjusting radiation source (not shown) may be directed to the resistor pattern 142 in, for example, the direction and location indicated by arrow 158. By way of illustration only, example dimensions of the resistor 140 illustrated in FIG. 2C may be: resistor pattern 142=50×50 mils, channel 144=20×30 mils and terminals 154 and 156=5 mils wide and 10 mils deep into the resistor pattern 142. It will be understood, however, that such dimensions may differ depending upon the application, and any such alternate dimensions are intended to fall within the scope of the claims appended hereto.

Yet another example embodiment of a thick-film resistor 160 is illustrated in FIG. 2D, and includes a resistor pattern formed from a known resistor material on a substrate in a generally rectangular configuration using known techniques therefore. The resistor pattern defines a first edge 162, a second edge 164 opposite the first edge 162, and a pair of opposing and generally parallel edges 166 and 168 extending edges 162 and 164. Edge 166 defines a v-shaped notch "N" positioned approximately equidistant from edges 162 and 164. A first electrical conductor 180 has a first terminal portion 182 extending to the resistor pattern along edge 164, and a second terminal portion 184 exiting the resistive material along edge 168. Similarly, a second electrical conductor 186 has a first terminal portion 188 extending to the resistor pattern along edge 162, and a second terminal portion 190 exiting the resistive material along edge 166. The electrical conductor 180 forms a right angle between terminal portions 182 and 184, and the electrical conductor 186 forms a right angle between terminal portions 188 and 190, although it will be understood that terminal portions 182 and 184, and/or terminal portions 188 and 190, may alternatively be formed at other angles or curvatures relative to each other. The terminal portions of electrical conductors 180 and 186 define a resistive path and a resistor value therebetween generally along the direction of arrows 192 and 194. The thick-film resistor 160 may be adjusted or "trimmed" in value via known techniques. An example of one such technique is via resistor value adjusting radiation; e.g., laser trimming, and radiation from a suitable resistor value adjusting radiation source (not shown) may be directed to the resistor pattern, for example, into the v-shaped notch "N" in the direction indicated by arrow 170. By way of illustration only, example dimensions of the resistor 160 illustrated in FIG. 2D may be: resistor pattern 162=30×40 mils, notch N=10 mils wide at open end×5 mils deep and terminals 184 and 166=5 mils wide. It will be understood, however, that such dimensions may differ depending upon the application, and any such alternate dimensions are intended to fall within the scope of the claims appended hereto.

Depending upon the material compositions of the resistive material used to form any of the thick-film resistors 100, 120, 140 and 160 and of the electrically conductive material used to form the electrical conductors thereto, differences in the coefficient of thermal expansion (CTE) of the two materials may result in undesirable stress therebetween. Such stress may occur, for example, in embodiments wherein the thick-film resistors 100, 120, 140 and 160 are formed of a ceramic-based resistive material and the corresponding electrical conductors are formed of copper (Cu), Aluminum (Al), and/or alloys thereof. Those skilled in the art will recognize other resistive material and electrical conductor composition combinations resulting in undesirable stress therebetween resulting from mismatches in CTEs. In such cases, it is desirable to size the terminal portions of the electrical conductors so as to minimize stress resulting from a mismatch between the coefficient of thermal expansion of the thick-film resistor material and the coefficient of thermal expansion of the terminal portions of the electrical conductors. Generally, such sizing of the terminal portions of the electrical conductors may be accomplished by minimizing the lengths and/or widths, where appropriate and where possible, to minimize the total surface areas defining the interfaces between the electrical conductors and the resistor patterns. Those skilled in the art will recognize, however, that the minimum lengths and/or widths of the terminal portions of the electrical conductors will generally be limited by a number of factors including, but not necessarily limited to, the current dissipation requirements of the resistor, the desired value of the resistor, and the like.

It may further be desirable with the thick-film resistor embodiments illustrated in FIGS. 2A–2D to configure the terminal portions of the electrical conductors such that, with a simple or relatively simple resistor pattern, a wide range of resistor values are possible simply by adjusting the positions of the electrical conductors and/or terminal portions thereof relative to the resistor patterns. For example, with the thick-film resistor embodiment 160 illustrated in FIG. 2D, the generally "L" shaped electrical conductors 180 and 186 allow for adjustment of their positions relative to the resistor pattern and to each other, as indicated by directional arrows 192 and 194, to provide for a wide range of resistor values using the simple rectangular resistor pattern illustrated in FIG. 2D. By moving the position of the electrical conductor 180 relative to the resistor pattern defining resistor 160 either toward or away from the electrical conductor 186 in the direction indicated by arrow 192, and/or by moving the position of the electrical conductor 186 relative to the resistor pattern defining resistor 160 either toward or away from the electrical conductor 180 in the direction indicated by arrow 194, many different resistor values are possible without altering the simple, rectangular shape of the resistor pattern. Likewise, by moving the position of the terminal portion 108A of the electrical conductor 108 relative to the resistor pattern 102 defining resistor 100 of FIG. 2D either toward or away from the terminal portion 110A of the electrical conductor 110, and/or by moving the position of the terminal portion 110A of the electrical conductor 110 relative to the resistor pattern 102 defining resistor 100 either toward or away from the terminal portion 108A of the electrical conductor 108, many different resistor values are possible without altering the simple, rectangular shape of the resistor pattern 102. With slightly more complicated resistor patterns, such as those illustrated in FIGS. 2B and 2C, positioning of the terminal portions of the electrical conductors 134, 136, 154 and 156 relative to each other and/or relative to the corresponding resistor patterns 122 and 142 respectively, allows for some adjustment in the corresponding resistor values, albeit less of an adjustment available with simpler resistor patterns such as those illustrated in FIGS. 2A and 2D.

Figure 3:
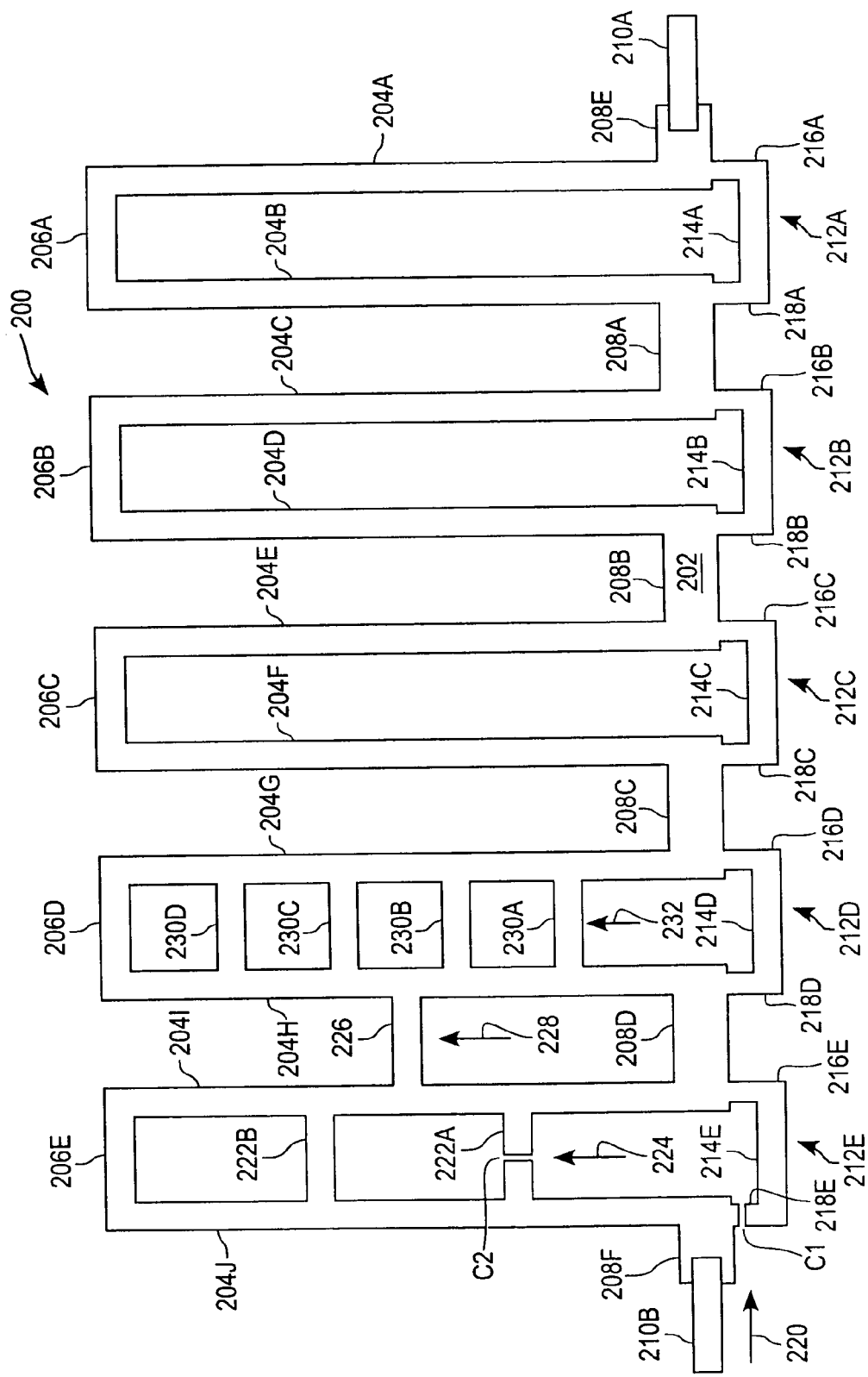
FIG. 3 is a top plan view of one embodiment of a thick film resistor formed in a serpentine configuration and including additional resistor material segments selectively formed to provide for incremental trimming of the resistor value.

Referring now to FIG. 3, a top plan view of an illustrative embodiment 200 of a thick film resistor is shown formed in a serpentine configuration and including additional resistor material segments selectively formed to provide for incremental adjustment of the resistor value. Thick-film resistor 200 is formed on a substrate from a thick-film resistor material 202 of known material composition in a serpentine configuration with a plurality of long legs having long edges positioned adjacent to each other and a plurality of short legs connecting alternate ends of the plurality of long legs such that resulting adjacent pairs of the long legs each have a closed end and an open end. In the illustrated embodiment, for example, resistor 200 includes 10 long legs 204A–204J positioned substantially parallel with each other, although those skilled in the art will recognize that one or more of the long legs 204A–204J need not be parallel, but may instead be merely positioned adjacent to neighboring long legs in any desired configuration. Five short legs, 206A–206E, connect the ends of pairs of adjacent long legs, e.g., short leg 206A connects the ends of adjacent long legs 204A and 204B, etc., such that these adjacent pairs of long legs have closed ends, e.g., where the short legs 206A–206E are formed, and opposite open ends, e.g., the ends of the long legs opposite the short legs 206A–206E. Four additional short legs, 208A–208D, connect alternate pairs of adjacent long legs, e.g., short leg 208A connects the ends of adjacent long legs 204B and 204C, etc., such that these alternate adjacent pairs of long legs have closed ends, e.g., where the short legs 208A–208E are formed, and opposite open ends, e.g., the ends of the long legs opposite the short legs 208A–208E.

In the illustrated embodiment, the terminal portion of a first electrical conductor 210A extends into the open end 208E of a first one of the long legs 204A to form a first electrical contact or terminal of resistor 200. Likewise, the terminal portion of a second electrical conductor 210B extends into the open end 208F of a last one of the long legs 204J to form a second electrical contact or terminal of resistor 200, such that the resistor 200 defines a resistor value between the terminal portions of the first and second electrical conductors 210A and 210B. Those skilled in the art will recognize that either of the resistor terminals may alternatively be defined at open or closed ends of any of the long legs 204A–204J, or at any of the short legs 206A–206E or 208A–208D, and any such alternate positioning of either of the resistor terminals is intended to fall within the scope of the claims appended hereto.

The thick-film resistor 200 further includes number of first resistor segments connecting open ends of one or more adjacent pairs of the long resistor legs. In the illustrated example, five such resistor segments 212A–212E are arranged to each connect the open ends of adjacent long leg pairs 204A–204B, 204C–204D, 204E–204F, 204G–204H and 204I–204J. It will be understood that the number of the first resistor segments included with resistor 200 may vary between one and as many open ends are defined by adjacent pairs of long resistor legs. It will further be understood that although the number of first resistor segments are illustrated in FIG. 3 as all being arranged on one side of the thick-film resistor 200, one or more of the first resistor segments may alternatively or additionally be formed on the opposite side of the resistor 200, e.g., to connect open ends of any one or more of the adjacent pairs of long legs 204B–204C, 204D–204E, 204F–204G and 204H–204I.

Any of the number of first resistor segments 212A–212E defines a resistance path therethrough that is less than any of the adjacent pairs of long legs. Consequently, any of the adjacent pairs of long resistor legs having an open end connected by one of the first resistor segments 212A–212E defines a smaller resistance than would otherwise be the case in the absence of the first resistor segment. In the embodiment illustrated in FIG. 3, for example, the value of the thick-film resistor 200 is initially defined through segments 212A–212E, which may be a substantially smaller resistance value than the value of the resistor 200 that would be defined through legs 204A–204J and 206A–206E in the absence of segments 212A–212E. Each of the number of first resistor segment, e.g., 212A–212E, is configured to be selectively open-circuited to incrementally adjust the resistance value of the resistor 200. Any known technique may be use for open circuiting one or more of the first number of thick-film resistor segments, e.g., 212A–212E, and in one embodiment resistor value adjusting radiation controllably applied via a resistor value adjusting radiation source, e.g., a laser, is used to cut through a portion of selected ones of the first number of resistor segments 212A–212E to thereby incrementally adjust the resistance value of the resistor 200.

In the illustrated embodiment, each of the number of first resistor segments 212A–212E has a long segment 214A–214E, positioned generally parallel with a corresponding short leg 206A–206E, connected at each end to a corresponding one of the adjacent long leg pairs via short segments 216A–216E and 218A–218E, wherein each of the short segments 216A–216E and 218A–218E are arranged generally perpendicularly to their corresponding long segments 214A–214E and generally parallel with their corresponding adjacent long leg pairs. In this embodiment, either of the short segments 216A–216E or 218A–218E, or the long segments 214A–214E, may be open-circuited via a known thick-film resistor open-circuiting technique. For example, in the embodiment illustrated in FIG. 3, the short segment 218E of resistor segment 212E is shown as being open-circuited via laser radiation directed through path C1 in the direction of arrow 220. As a result, current flowing from short leg 208D to terminal 210B, or vice-versa, must then flow through legs 204I, 206E and 204J, and the resistance value of the resistor 200 is thereby incrementally increased. In any case, it will be understood that any one or more of the number of first resistor segments 212A–212E may be arranged in any desired shape as long as each connect an open end of an appropriate pair of adjacent long legs 204A–204J, and as long as each may be open-circuited via a known thick-film resistor open-circuiting technique.

Resistor 200 may further include a number of second resistor segments connecting adjacent pairs of long resistor legs 204A–204E somewhere along their long edges between open and closed ends thereof. In the illustrated example, two such resistor segments 222A and 212B are connected between adjacent long legs 204I and 204J to divide each of the long legs 204I and 204J into three possible resistance values. In the absence of resistor segment 212E, if resistor segment 222A is intact, then the resistance value from terminal 210B and short leg 208D is defined through leg 204J, segment 222A and leg 204I. If, however, resistor segment 222A has been selectively open circuited, such as via laser radiation directed through path C2 in the direction of arrow 224, the resistance value from terminal 210B and short leg 208D is defined through leg 204J, segment 222B and leg 204I. Finally, if both of the resistor segments 222A and 222B have been selectively open-circuited, the resistance value from terminal 210 and short leg 208D is defined through leg 204J, leg 206E and leg 204I. Those skilled in the art will recognize that any number of the second resistor segments may be arranged between any one or more of the pairs of adjacent long resistor legs, wherein each of the number of second resistor segments is configured to be open-circuited via a known thick-film resistor opening technique. For example, one such resistor segment 226 is shown in FIG. 3 as connected between adjacent long resistor legs 204H and 204I, wherein segment 226 may be open-circuited, such as via resistor value adjusting radiation directed along the path indicated by arrow 228, to provide for up to two different resistance values between resistor legs 206D and 206E. As another example, four such resistor segments 230A–230D are illustrated in FIG. 3 as connected between adjacent long legs 204G and 204H, wherein any one or more of the resistor segments 230A–230D may be selectively open-circuited, such as via resistor value adjusting radiation directed along the path indicated by arrow 232, to provide for up to five different resistor values between resistor legs 208D and 208C. It will be understood that although each of the resistor segments 222A–222B, 226 and 230A–230D are illustrated in FIG. 3 as being arranged generally perpendicularly to their corresponding long leg pairs and generally parallel with their corresponding short legs, any one or more of the number of second resistor segments 222A–222B, 226 or 230A–230D may be arranged in any desired shape as long as each connects together an adjacent pair of long legs between it open and closed ends, and as long as each may be open-circuited via a known thick-film resistor open-circuiting technique.

While the invention has been illustrated and described in detail in the foregoing drawings and description, the same is to be considered as illustrative and not restrictive in character, it being understood that only illustrative embodiments thereof have been shown and described and that all changes and modifications that come within the spirit of the invention are desired to be protected.

The invention claimed is:

1. A thick-film resistor component, comprising:
    a first electrically conductive sheet having first and second opposite surfaces;
    a first thick-film component having first and second opposite surfaces, the first surface of the first thick-film component adhered to the first surface of the first sheet;
    a first thick-film resistor having first and second surfaces, the first surface of the first resistor adhered to the second surface of the first thick-film component and to the first surface of the first sheet adjacent to the first thick-film component; and
    a first electrically insulating layer formed over the combination of the first thick-film component and the first resistor and the first electrically conductive sheet;
    wherein a portion of the first sheet is selectively removed adjacent to the first thick-film component such that a remaining first portion of the first sheet defines a first electrical contact to the first resistor, a remaining second portion of the first sheet defines a second electrical contact to the first resistor, and the first surface of the first thick-film component is at least partially exposed therebetween, the first resistor forming the thick-film resistor component between the first and second contacts
    wherein the portion of the first electrically conductive sheet is selectively removed via an etchant; and
    wherein the first thick-film component is formed of a material that is unreactive with the etchant and the first thick-film resistor is formed of a material that is reactive with the etchant, the first thick-film component shielding the first thick-film resistor from the etchant.

2. The resistor component of claim 1 wherein the first thick-film component is formed of an electrically insulating material.

3. The resistor component of claim 2 wherein the electrically insulating material forming the first thick-film component is silicon dioxide.

4. The resistor component of claim 1 wherein the first thick-film component is a second thick-film resistor;
    and wherein the second surface of the second thick-film resistor is electrically bonded to the first surface of the first resistor;
    and wherein the first and second contacts are each in electrical contact with both of the first and second thick-film resistors, the first and second thick-film resistors defining a parallel-connected thick-film resistor component.

5. The resistor component of claim 4 wherein the material forming the first thick-film resistor has a higher metal content than the material forming the second thick-film resistor.

6. The resistor component of claim 4 wherein the first thick-film resistor is a low-valued sense resistor and the second thick-film resistor has a resistor value substantially higher than the low-valued sense resistor.

7. The resistor component of claim 4 wherein the first thick-film resistor is formed of a combination of a metallic compound and an electrically insulating material and the second thick-film resistor is formed of a polymer-based resistor film.

8. The resistor component of claim 1 further including an electrically insulating film formed over the second surface of the first thick-film resistor and in contact with the first surface of the first sheet about a periphery of the combination of the first thick-film component and first thick-film resistor;
    and wherein the first electrically insulating layer is formed over and in contact with the electrically insulating film and the first surface of the first electrically conductive sheet, the electrically insulating film configured to bond to both the second surface of the first thick-film resistor and the first electrically insulating layer.

9. The resistor component of claim 8 wherein the first insulating layer is a flexible insulating layer.

10. The resistor component of claim 9 wherein the electrically insulating film is configured to support the combination of the first thick-film component and the first thick-film resistor, and provide stress relief to the combination of the first thick-film component and the first thick-film resistor, between the first and second electrical contacts.

11. The resistor component of claim 10 wherein the electrically insulating film is formed as a combination of a polymer and ceramic.

12. The resistor component of claim 1 further including a second electrically insulating layer formed over the second surface of the first sheet and in contact with the at least partially exposed first surface of the first thick-film component.

13. The resistor component of claim 12 wherein the second insulating layer is a flexible insulating layer.

14. The resistor component of claim 12 further including a second electrically conductive sheet formed over the second electrically insulating layer.

15. The resistor component of claim 14 further including:

a number of thermally conductive members extending through the second electrically insulating layer in contact with a remaining third portion of the first electrically conductive sheet in contact with the first thick-film component and positioned between the first and second electrical contacts; and a thermally conductive sheet formed on the second electrically insulating layer in electrical contact with the number of thermally conductive members and electrically isolated from the second electrically conductive layer, the third portion of the first electrically conductive sheet, the number of thermally conductive members and the thermally conductive sheet forming a heat sink for the thick-film resistor component.

* * * * *